(12) United States Patent
Tang (10) Patent No.: US 12,274,151 B2
(45) Date of Patent: Apr. 8, 2025

(54) DISPLAY PANEL AND PREPARATION METHOD THEREOF

(71) Applicant: Shenzhen China Star Optoelectronics Semiconductor Display Technology Co., Ltd., Guangdong (CN)

(72) Inventor: Jia Tang, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 813 days.

(21) Appl. No.: 17/600,258

(22) PCT Filed: Jul. 21, 2021

(86) PCT No.: PCT/CN2021/107635
§ 371 (c)(1),
(2) Date: Sep. 30, 2021

(87) PCT Pub. No.: WO2023/279439
PCT Pub. Date: Jan. 12, 2023

(65) Prior Publication Data
US 2023/0016730 A1 Jan. 19, 2023

(30) Foreign Application Priority Data
Jul. 8, 2021 (CN) .................. 202110771237.X (51) Int. Cl.
*H10K 59/80* (2023.01)
*H10K 59/12* (2023.01)
(Continued)

(52) U.S. Cl.
CPC ..... *H10K 59/80518* (2023.02); *H10K 59/122* (2023.02); *H10K 59/30* (2023.02);
(Continued)

(58) Field of Classification Search
CPC ...... H10K 59/30; H10K 59/35; H10K 59/351; H10K 59/352; H10K 59/353; H10K 59/80518; H10K 59/877; H10K 59/878
See application file for complete search history.

(56) References Cited

U.S. PATENT DOCUMENTS

| 2018/0301656 A1 | 10/2018 | Ji |
| 2020/0227685 A1 | 7/2020 | Kyoung et al. |
| 2022/0140016 A1* | 5/2022 | Zeng ............. H10K 59/80515 257/72 |

FOREIGN PATENT DOCUMENTS

| CN | 102760841 A | 10/2012 |
| CN | 111769212 A | 10/2020 |
| CN | 112310319 A | 2/2021 |

* cited by examiner

*Primary Examiner* — Zandra V Smith
*Assistant Examiner* — Molly K Reida
(74) *Attorney, Agent, or Firm* — Rivka Friedman (57) ABSTRACT

A display panel and a preparation method thereof are disclosed in the present disclosure. The display panel includes an anode layer and a light-emitting layer. The anode layer includes a first anode and a second anode. There is a gap between the first anode and the second anode. The first anode includes a first reflection portion, and the second anode includes a second reflection portion. A reflectivity of the first reflection portion is less than a reflectivity of the second reflection portion. The light-emitting layer includes a green light emitting portion and a blue light emitting portion that are correspondingly disposed on the first anode and the second anode respectively.

18 Claims, 6 Drawing Sheets

(51) Int. Cl.
   *H10K 59/122*   (2023.01)
   *H10K 59/30*   (2023.01)
   *H10K 59/35*   (2023.01)
   *H10K 102/00*   (2023.01)
(52) U.S. Cl.
   CPC ........... *H10K 59/35* (2023.02); *H10K 59/878* (2023.02); *H10K 59/1201* (2023.02); *H10K 2102/351* (2023.02)

DISPLAY PANEL AND PREPARATION METHOD THEREOF

FIELD OF INVENTION

The present disclosure relates to the field of display technologies, and specifically, to a display panel and a preparation method thereof.

BACKGROUND OF INVENTION

Currently, light emitting efficiencies of different colors of an organic light-emitting diode (OLED) are obviously different. A green light emitting material has the highest efficiency, and a blue light emitting material has the lowest efficiency (the light emitting efficiency of the green light emitting material is about 15 to 30 times the light emitting efficiency of the blue light emitting material). When the OLED displays, to avoid a color cast caused by a great difference between light emitting efficiencies of different sub-pixels (such as green sub-pixels and blue sub-pixels), a system algorithm is usually used to adjust driving currents of the green sub-pixels and the blue sub-pixels, to balance the difference between the light emitting efficiencies. For the blue sub-pixels, when the pixel driving current is increased, the efficiency is improved, but the material service life is shortened.

Therefore, there is current an urgent need for a display panel that can reduce the difference between the light emitting efficiencies of the green sub-pixels and the blue sub-pixels without affecting the service life.

SUMMARY OF INVENTION

Technical Problem

The embodiments of the present disclosure provide a display panel and a preparation method thereof, to resolve the problem that the light emitting efficiencies of blue sub-pixels and green sub-pixels are imbalanced.

Technical Solution

The present disclosure provides a display panel, including:
- an array substrate;
- a planarization layer, disposed on the array substrate;
- an anode layer, disposed on the planarization layer, wherein the anode layer includes a first anode and a second anode; there is a gap between the first anode and the second anode; the first anode includes a first reflection portion, and the second anode includes a second reflection portion; and a reflectivity of the first reflection portion is less than a reflectivity of the second reflection portion; and
- a light-emitting layer, disposed on the anode layer, wherein the light-emitting layer includes a green light emitting portion and a blue light emitting portion; and the green light emitting portion is disposed on the first anode, and the blue light emitting portion is disposed on the second anode.

Optionally, in some embodiments of the present disclosure, a surface of the second reflection portion close to the light-emitting layer includes a rough structure.

Optionally, in some embodiments of the present disclosure, the reflectivity of a material of the first reflection portion is less than 65%, and the reflectivity of a material of the second reflection portion is greater than 88%.

Optionally, in some embodiments of the present disclosure, the material of the first reflection portion includes one or a combination of two or more of molybdenum, titanium, and copper, and the material of the second reflection portion includes one or a combination of silver and aluminum.

Optionally, in some embodiments of the present disclosure, the first anode further includes an additional conductive portion, the additional conductive portion being located on the first reflection portion, and the second anode further includes a first conductive portion and a second conductive portion, the first conductive portion and the second conductive portion being sequentially stacked on the second reflection portion.

Optionally, in some embodiments of the present disclosure, the thicknesses of the first conductive portion, the second conductive portion, and the additional conductive portion are all less than 400 Å.

Optionally, in some embodiments of the present disclosure, a sum of the thicknesses of the first conductive portion and the second conductive portion is in a range of 400 to 1200 Å.

Optionally, in some embodiments of the present disclosure, the second anode further includes a first additional reflection portion, the first additional reflection portion being disposed between the second reflection portion and the array substrate.

Optionally, in some embodiments of the present disclosure, the second conductive portion covers the second reflection portion and the first conductive portion.

Optionally, in some embodiments of the present disclosure, the display panel further includes an interlayer dielectric layer, the interlayer dielectric layer being disposed between the planarization layer and the anode layer.

Correspondingly, the present disclosure further provides a display panel, including:
- an array substrate;
- an anode layer, disposed on the array substrate, wherein the anode layer includes a first anode and a second anode; there is a gap between the first anode and the second anode; the first anode includes a first reflection portion, and the second anode includes a second reflection portion; and a reflectivity of the first reflection portion is less than a reflectivity of the second reflection portion; and
- a light-emitting layer, disposed on the anode layer, wherein the light-emitting layer includes a green light emitting portion and a blue light emitting portion; and the green light emitting portion is disposed on the first anode, and the blue light emitting portion is disposed on the second anode.

Optionally, in some embodiments of the present disclosure, a surface of the second reflection portion close to the light-emitting layer includes a rough structure.

Optionally, in some embodiments of the present disclosure, the reflectivity of a material of the first reflection portion is less than 65%, and the reflectivity of a material of the second reflection portion is greater than 88%.

Optionally, in some embodiments of the present disclosure, the material of the first reflection portion includes one or a combination of two or more of molybdenum, titanium, and copper, and the material of the second reflection portion includes one or a combination of silver and aluminum.

Optionally, in some embodiments of the present disclosure, the first anode further includes an additional conductive portion, the additional conductive portion being located on the first reflection portion, and the second anode further includes a first conductive portion and a second conductive portion, the first conductive portion and the second conductive portion being sequentially stacked on the second reflection portion.

Optionally, in some embodiments of the present disclosure, the thicknesses of the first conductive portion, the second conductive portion, and the additional conductive portion are all less than 400 Å.

Optionally, in some embodiments of the present disclosure, a sum of the thicknesses of the first conductive portion and the second conductive portion is in a range of 400 to 1200 Å.

Optionally, in some embodiments of the present disclosure, the second anode further includes a first additional reflection portion, the first additional reflection portion being disposed between the second reflection portion and the array substrate.

Optionally, in some embodiments of the present disclosure, the second anode further includes a first additional reflection portion, the first additional reflection portion being disposed between the second reflection portion and the array substrate.

Optionally, in some embodiments of the present disclosure, the second conductive portion covers the second reflection portion and the first conductive portion.

Correspondingly, the present disclosure further provides a preparation method of a display panel, including:

providing an array substrate;

forming an anode layer on the array substrate, wherein the anode layer includes a first anode and a second anode; there is a gap between the first anode and the second anode; the first anode includes a first reflection portion, and the second anode includes a second reflection portion; and a reflectivity of the first reflection portion is less than a reflectivity of the second reflection portion; and forming a light-emitting layer on the anode layer, wherein the light-emitting layer includes a green light emitting portion and a blue light emitting portion; and the green light emitting portion is disposed on the first anode, and the blue light emitting portion is disposed on the second anode.

Beneficial Effects

A display panel and a preparation method thereof are disclosed in the present disclosure. The display panel includes an array substrate, an anode layer, and a light-emitting layer. The anode layer is disposed on the array substrate and includes a first anode and a second anode. There is a gap between the first anode and the second anode. The first anode includes a first reflection portion, and the second anode includes a second reflection portion. A reflectivity of the first reflection portion is less than a reflectivity of the second reflection portion. The light-emitting layer is disposed on the anode layer and includes a green light emitting portion and a blue light emitting portion. The green light emitting portion is disposed on the first anode, and the blue light emitting portion is disposed on the second anode. In the present disclosure, the first anode corresponding to the green light emitting portion is made of the material with a low reflectivity, reducing the light emitting efficiency of a region of the green light emitting portion, while the second anode corresponding to the blue light emitting portion is made of the material with a high reflectivity, improving the light emitting efficiency of a region of the blue light emitting portion, so that the light emitting efficiencies of the regions of the green light emitting portion and the blue light emitting portion are balanced, thereby improving the display uniformity of the display panel.

BRIEF DESCRIPTION OF DRAWINGS

To describe the technical solutions in the embodiments of the present disclosure more clearly, the following briefly describes accompanying drawings required for describing the embodiments. Apparently, the accompanying drawings in the following descriptions show merely some embodiments of the present disclosure, and a person skilled in the art may still derive other accompanying drawings from these accompanying drawings without creative efforts.

DETAILED DESCRIPTION OF PREFERRED EMBODIMENTS

The technical solutions in the embodiments of the present disclosure are clearly and completely described below with reference to the accompanying drawings in the embodiments of the present disclosure. Apparently, the described embodiments are merely some rather than all of the embodiments of the present disclosure. All other embodiments obtained by a person skilled in the art based on the embodiments of the present disclosure without creative efforts shall fall within the protection scope of the present disclosure. In addition, it should be understood that the specific implementations described herein are merely used for describing and illustrating the present disclosure, but are not intended to limit the present disclosure. In the present disclosure, without the contrary explanation, the directional terms such as "above" and "below" generally refer to "above" and "below" in actual use or a working state of a device, and specifically refer to drawing directions of the corresponding accompanying drawings; and "inside" and "outside" are relative to the contour of the device.

The embodiments of the present disclosure provide a display panel and a preparation method thereof. Detailed descriptions are separately provided below.

Figure 1:
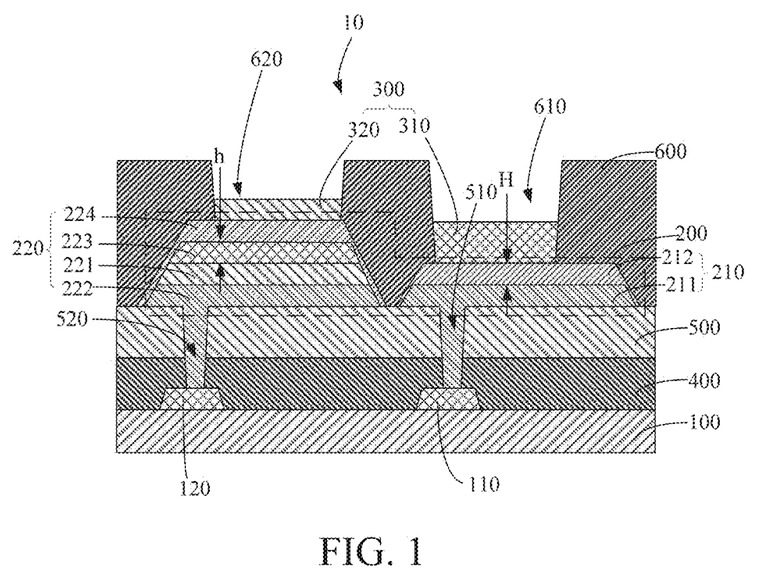
FIG. 1 is a schematic diagram of a first structure of a display panel according to an embodiment of the present disclosure.

Referring to FIG. 1, FIG. 1 is a schematic diagram of a first structure of a display panel according to an embodiment of the present disclosure. A display panel 10 is provided in the present disclosure. The display panel 10 includes an array substrate 100, an anode layer 200, and a light-emitting layer 300.

The array substrate 100 includes a first thin film transistor and a second thin film transistor. The first thin film transistor and the second thin film transistor are disposed in the same layer. The first thin film transistor includes a first source 110. The second thin film transistor includes a second source 120.

In an embodiment, the display panel 10 further includes a planarization layer 400. The planarization layer 400 is disposed on the array substrate 100.

In an embodiment, the display panel 10 further includes an interlayer dielectric layer 500. The interlayer dielectric layer 500 is disposed on the planarization layer 400. The interlayer dielectric layer 500 is provided with a first through hole 510 and a second through hole 520. The first through hole 510 runs through the interlayer dielectric layer 500 and the planarization layer 400 to expose the first source 110. The second through hole 520 runs through the interlayer dielectric layer 500 and the planarization layer 400 to expose the second source 120.

The anode layer 200 is disposed on the interlayer dielectric layer 500. The anode layer 200 includes a first anode 210 and a second anode 220. There is a gap between the first anode 210 and the second anode 220. The first anode 210 includes a first reflection portion 211. The first reflection portion 211 extends into the first through hole 510 to connect to the first source 110. The second anode 220 includes a second reflection portion 221. A reflectivity of the first reflection portion 211 is less than a reflectivity of the second reflection portion 221.

In an embodiment, the reflectivity of a material of the first reflection portion 211 is less than 65%.

In an embodiment, the material of the first reflection portion 211 includes one or a combination of two or more of molybdenum, titanium, and copper.

In an embodiment, the reflectivity of a material of the second reflection portion 221 is greater than 88%.

In an embodiment, the material of the second reflection portion 221 includes one or a combination of silver and aluminum.

In an embodiment, a surface of the second reflection portion 221 far away from the array substrate 100 includes a rough structure.

In the present disclosure, the rough structure is disposed on the surface of the second reflection portion 221 far away from the array substrate 100, to enable more light rays to be reflected, thereby further improving the display performance of the display panel 10.

In an embodiment, the first anode 210 further includes an additional conductive portion 212. The additional conductive portion 212 is located on the first reflection portion 211. A material of the additional conductive portion 212 is selected from indium tin oxide and zinc oxide.

In an embodiment, a thickness H of the additional conductive portion 212 is less than 400 Å.

In an embodiment, the thickness H of the additional conductive portion 212 is in a range of 1 to 399 Å. Specifically, the thickness H of the additional conductive portion 212 may be 1 Å, 20 Å, 80 Å, 180 Å, 220 Å, 370 Å, 390 Å, 400 Å, or the like.

Figure 2:
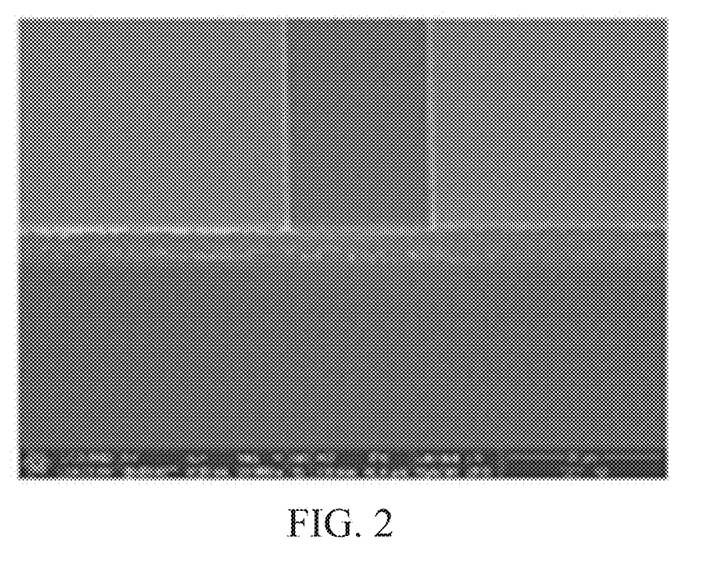
FIG. 2 is a scanning electron microscope image of a display panel according to an embodiment of the present disclosure.
Figure 3:
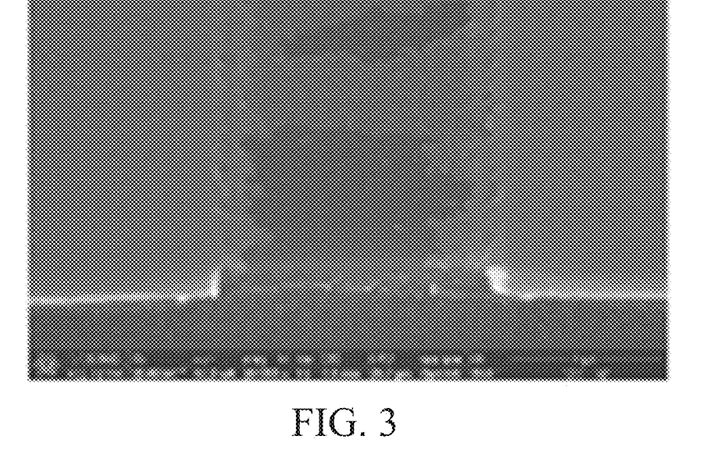
FIG. 3 is a scanning electron microscope image of a display panel according to the related art.

Referring to FIGS. 2 and 3, FIG. 2 is a scanning electron microscope image of a display panel according to an embodiment of the present disclosure. FIG. 3 is a scanning electron microscope image of a display panel according to the related art. In the related art, the thickness of the additional conductive portion 212 deposited each time is greater than 400 Å. For example, the thickness of the additional conductive portion 212 deposited each time is 500 Å, so that there are residues and crystals when the additional conductive portion 212 in a region outside the first reflection portion 211 is subsequently etched. However, in the present disclosure, the thickness H of the additional conductive portion 212 is set to be less than 400 Å, that is, the thickness H of the additional conductive portion 212 is in a range of 1 to 399 Å, so that there is neither residue nor crystal when the additional conductive portion 212 located outside the first reflection portion 211 is subsequently etched, thereby ensuring the display effect of the display panel 10.

In an embodiment, the second anode 220 further includes a first additional reflection portion 222, a first conductive portion 223, and a second conductive portion 224. The first additional reflection portion 222 and the first reflection portion 211 are disposed in the same layer. The first additional reflection portion 222 extends into the second through hole 520 to connect to the second source 120. A material of the first additional reflection portion 222 includes one or a combination of two or more of molybdenum, titanium, and copper. The second reflection portion 221, the first conductive portion 223, and the second conductive portion 224 are sequentially stacked on the first additional reflection portion 222.

In an embodiment, a thickness h of the first conductive portion 223 is less than 400 Å.

In an embodiment, the thickness h of the first conductive portion 223 is in a range of 1 to 399 Å. Specifically, the thickness h of the first conductive portion 223 may be 1 Å, 50 Å, 120 Å, 210 Å, 330 Å, 370 Å, 390 Å, 399 Å, or the like.

In an embodiment, a thickness of the second conductive portion 224 is same as the thickness H of the additional conductive portion 212, that is, in a range of 1 to 399 Å.

In the present disclosure, the thicknesses of the additional conductive portion 212, the first conductive portion 223, and the second conductive portion 224 are set to be all less than 400 Å, so that when subsequently etched, there is no residue in the region outside the first reflection portion 211 and the second reflection portion 221, thereby ensuring the display quality of the display panel 10.

In an embodiment, there may be a plurality of layers of first conductive portions 223 and a plurality of layers of second conductive portions 224 of the second anode 220.

In an embodiment, a sum of the thicknesses of the first conductive portion 223 and the second conductive portion 224 is in a range of 400 to 1200 Å.

In an embodiment, the display panel 10 further includes a pixel definition layer 600. The pixel definition layer 600 is disposed on the array substrate 100 and the anode layer 200. The pixel definition layer 600 is provided with a first via hole 610 and a second via hole 620. The first via hole 610 runs through the pixel definition layer 600 to expose the additional conductive portion 212. The second via hole 620 runs through the pixel definition layer 600 to expose the second conductive portion 224.

The light-emitting layer 300 is disposed on the anode layer 200. The light-emitting layer 300 includes a green light emitting portion 310 and a blue light emitting portion 320. The green light emitting portion 310 is disposed in the first via hole 610. The blue light emitting portion 320 is disposed in the second via hole 620.

In the present disclosure, the first anode 210 corresponding to the green light emitting portion 310 is made of the material with a low reflectivity, reducing the light emitting efficiency of a region of the green light emitting portion 310, that is, reducing the light emitting efficiency of green sub-pixels, while the second anode 220 corresponding to the blue light emitting portion 320 is made of the material with a high reflectivity, improving the light emitting efficiency of a region of the blue light emitting portion 320, that is, improving the light emitting efficiency of blue sub-pixels, so that the light emitting efficiencies of the green sub-pixels and the blue sub-pixels are balanced, thereby improving the display uniformity of the display panel 10. The rough structure is disposed on a surface of the second reflection portion 221 close to the light-emitting layer 300, to further improve the light emitting efficiency of the blue sub-pixels, thereby further improving the display uniformity of the display panel 10. The thicknesses of the additional conductive portion 212, the first conductive portion 223, and the second conductive portion 224 are set to be all in a range of 1 to 399 Å, so that when subsequently etched, there is no residue in the regions of the first conductive portion 223 and the second conductive portion 224 outside the first reflection portion 211 and the second reflection portion 221, thereby ensuring the display quality of the display panel 10.

Figure 4:
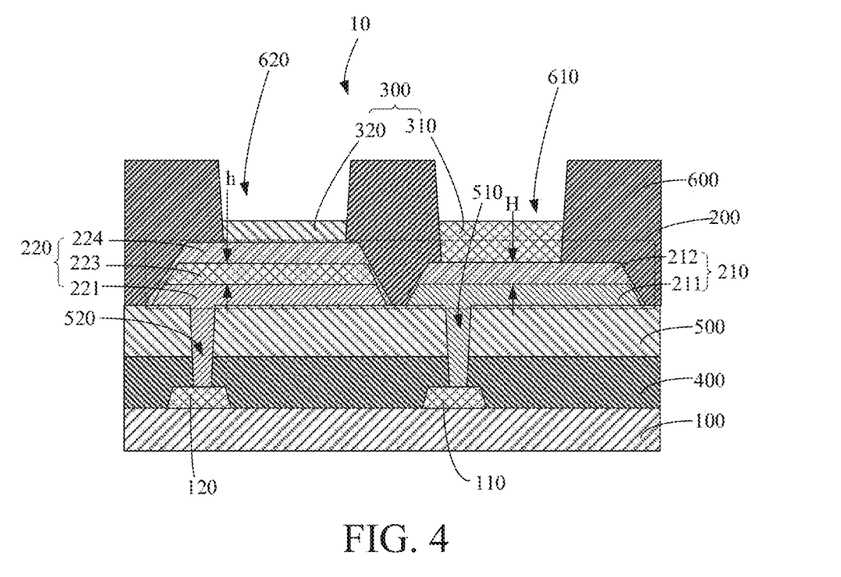
FIG. 4 is a schematic diagram of a second structure of a display panel according to an embodiment of the present disclosure.

Referring to FIG. 4, FIG. 4 is a schematic diagram of a second structure of a display panel according to an embodiment of the present disclosure. It should be noted that, a difference between the second structure and the first structure is as follows:

The first additional reflection portion 222 is not disposed in the second anode 220. The second reflection portion 221 extends into the second through hole 520 to connect to the second source 120.

In the present disclosure, the first additional reflection portion 222 is not disposed in the second anode 220, thereby reducing production costs while ensuring the display uniformity of the display panel 10.

Referring to FIG. 5 and FIGS. 6 to 12, FIG. 5 is a flowchart of a preparation method of a display panel according to an embodiment of the present disclosure. FIGS. 6 to 12 are schematic structural flowcharts of a preparation method of a display panel according to an embodiment of the present disclosure.

Figure 5:
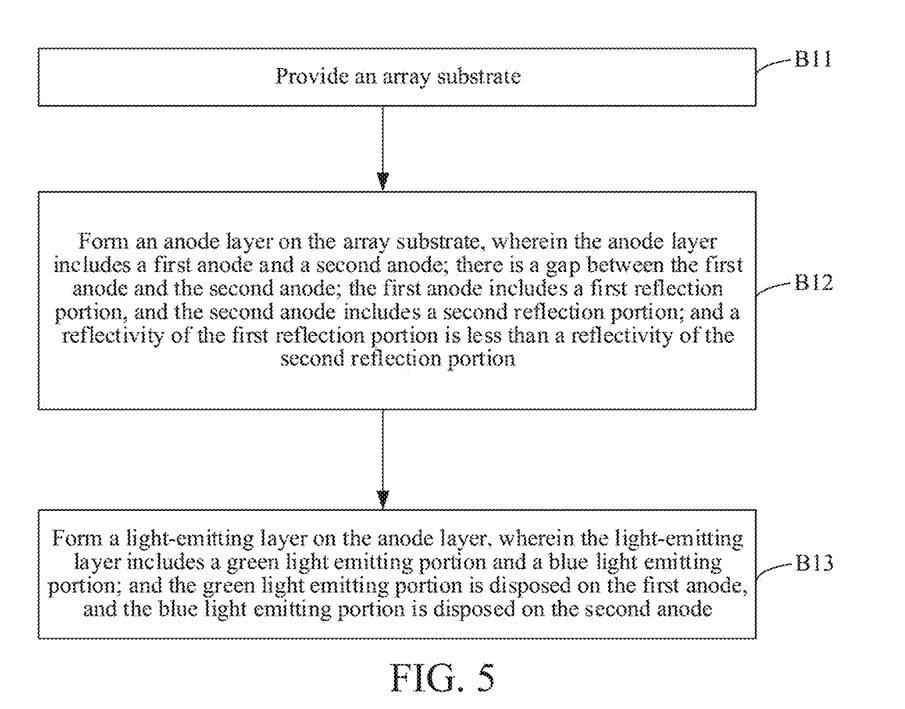
FIG. 5 is a flowchart of a preparation method of a display panel according to an embodiment of the present disclosure.

B11. Provide an array substrate.

Figure 6:
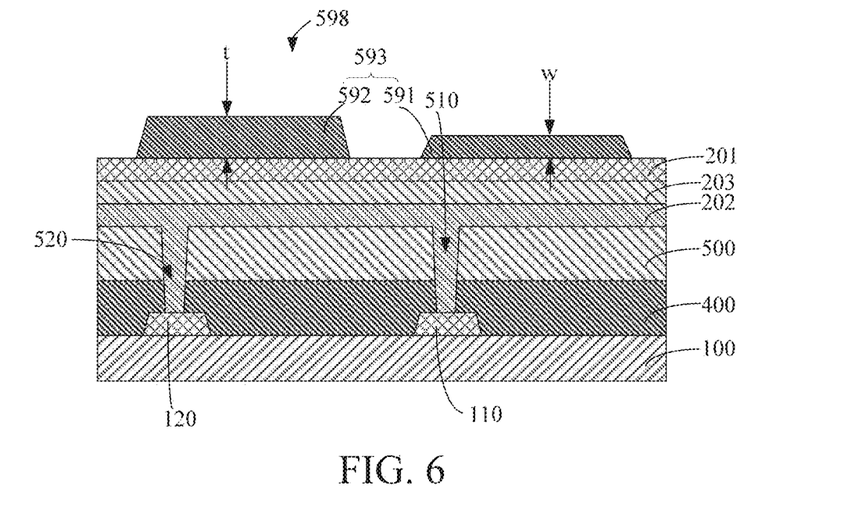
FIGS. 6 to 12 are schematic structural flowcharts of a preparation method of a display panel according to an embodiment of the present disclosure.

Referring to FIG. 6, specifically, the array substrate 100 includes a first thin film transistor and a second thin film transistor. The first thin film transistor and the second thin film transistor are disposed in the same layer. The first thin film transistor includes a first source 110. The second thin film transistor includes a second source 120.

In an embodiment, after step B11, the method further includes:

disposing a planarization layer 400 on the array substrate 100.

In an embodiment, after the step of disposing a planarization layer 400 on the array substrate 100, the method further includes:

forming an interlayer dielectric layer 500 on the planarization layer 400. The interlayer dielectric layer 500 is provided with a first through hole 510 and a second through hole 520. The first through hole 510 runs through the interlayer dielectric layer 500 and the planarization layer 400 to expose the first source 110. The second through hole 520 runs through the interlayer dielectric layer 500 and the planarization layer 400 to expose the second source 120.

B12. Form an anode layer on the array substrate, wherein the anode layer includes a first anode and a second anode; there is a gap between the first anode and the second anode; the first anode includes a first reflection portion, and the second anode includes a second reflection portion; and a reflectivity of the first reflection portion is less than a reflectivity of the second reflection portion.

Figure 7:
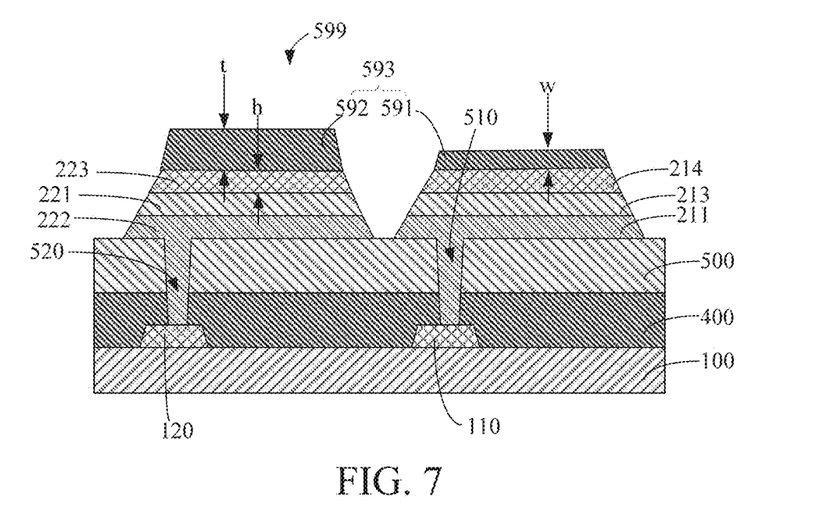

Referring to FIGS. 6 and 7, specifically, materials of the first reflection portion 211, the second reflection portion 221, and a first conductive layer 201 are sequentially stacked on the array substrate 100, to form a first intermediate product 598. The material of the first reflection portion 211 is a material of a first reflection layer 202. The material of the second reflection portion 221 is a material of a second reflection layer 203. Then, a first photoresist layer 593 is provided. The first photoresist layer 593 includes a first portion 591 and a second portion 592. A thickness w of the first portion 591 is less than a thickness t of the second portion 592.

Figure 8:
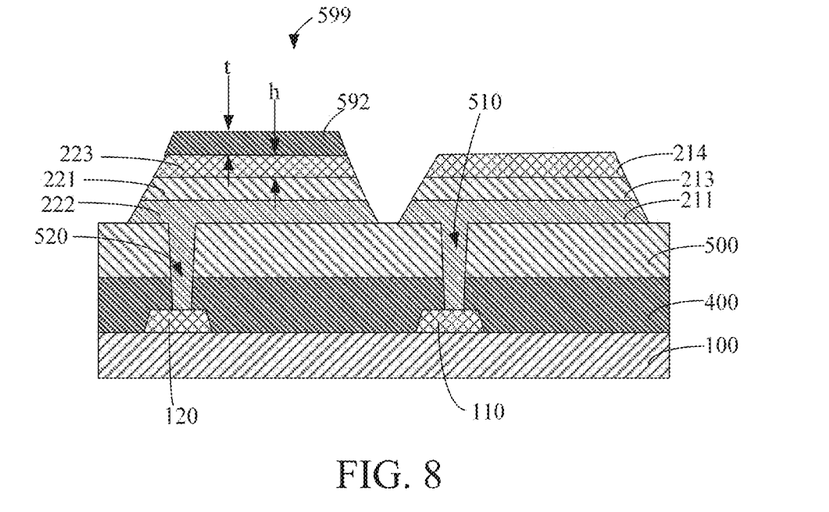
Figure 9:
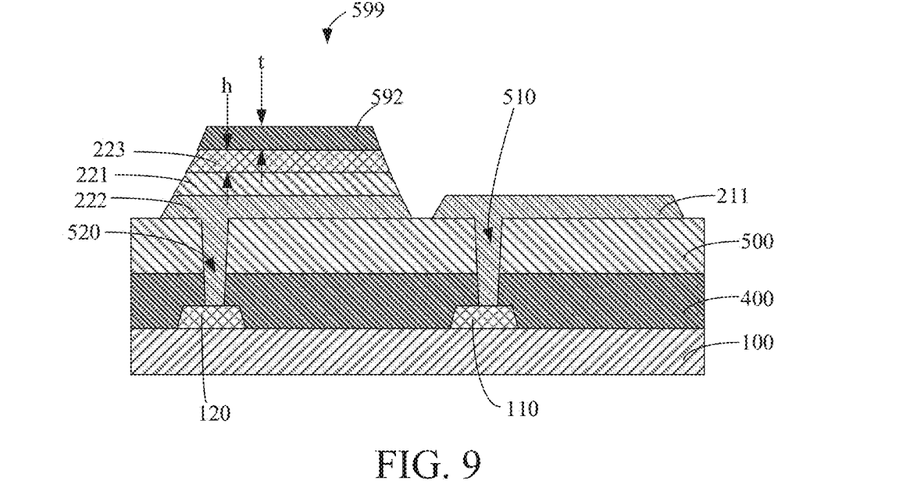

Referring to FIG. 7 to FIG. 9, the first intermediate product 598 is wet-etched to form a second intermediate product 599. That is, the material of the first reflection layer 202 corresponding to the first portion 591 forms the first reflection portion 211. The material of the first reflection layer 202 corresponding to the second portion 592 forms the first additional reflection portion 222. The material of the second reflection layer 203 corresponding to the first portion 591 forms a second additional reflection portion 213. The material of the second reflection layer 203 corresponding to the second portion 592 forms the second reflection portion 221. The material of the first conductive layer 201 corresponding to the first portion 591 forms a sacrificial portion 214. The material of the first conductive layer 201 corresponding to the second portion 592 forms a first conductive portion 223. That is, the first additional reflection portion 222, the second reflection portion 221, and the first conductive portion 223 are sequentially stacked. The first reflection portion 211, the second additional reflection portion 213, and the sacrificial portion 214 are sequentially stacked.

The thickness h of the first conductive portion 223 is less than 400 Å. That is, a thickness of the deposited material of the first conductive layer 201 is less than 400 Å.

Still referring to FIGS. 8 and 9, then the first portion 591 is removed, and in this case, the thickness of the second portion 592 is reduced. Next, the second intermediate product 599 is wet-etched, the second additional reflection portion 213 and the sacrificial portion 214 are removed, and then the second portion 592 is removed.

Figure 10:
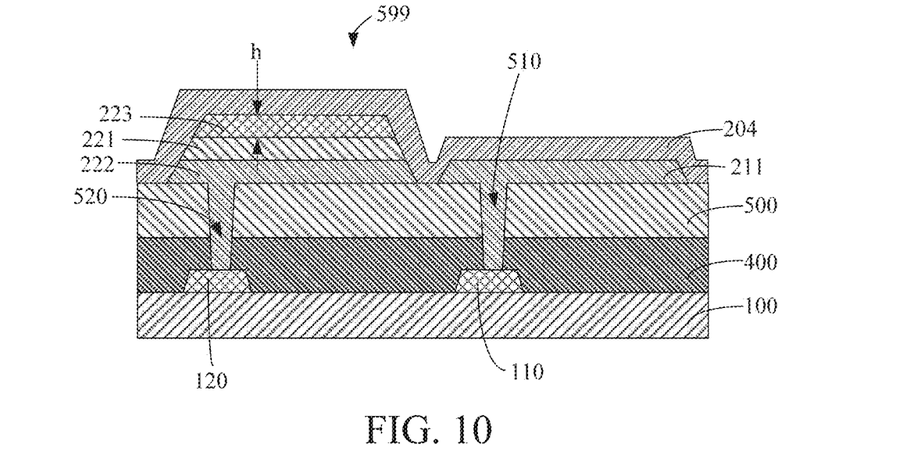

Referring to FIG. 10, then a material of a second conductive layer 204 is disposed on the interlayer dielectric layer 500, the first reflection portion 211, the first additional reflection portion 222, the second reflection portion 221, and the first conductive portion 223.

Figure 11:
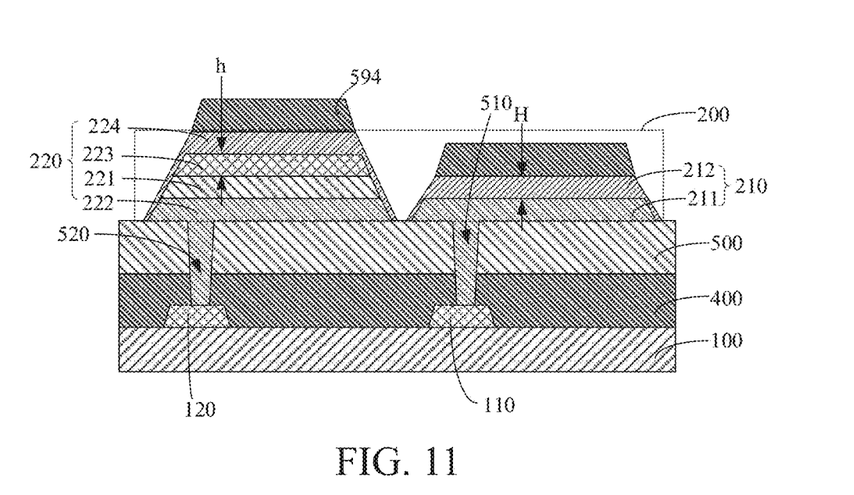

Referring to FIG. 11, a second photoresist layer 594 is provided, and the material of the second conductive layer 204 is etched, to form an additional conductive portion 212 and a second conductive portion 224, and then the second photoresist layer 594 is removed. The additional conductive portion 212 is located on the first reflection portion 211, and the second conductive portion 224 is located on the first conductive portion 223.

The thickness H of the additional conductive portion 212 is less than 400 Å. The thickness of the second conductive portion 224 is same as the thickness H of the additional conductive portion 212, and a thickness of the deposited material of the second conductive layer 204 is less than 400 Å.

The first reflection portion 211 and the additional conductive portion 212 form a first anode 210 of an anode layer 200. The first additional reflection portion 222, the second reflection portion 221, the first conductive portion 223, and the second conductive portion 224 form a second anode 220 of the anode layer 200.

In an embodiment, a surface of the second reflection portion 221 far away from the array substrate 100 includes a rough structure.

In the present disclosure, the rough structure is disposed on the surface of the second reflection portion 221 far away from the array substrate 100, increasing the surface area of the second reflection portion 221, enabling more light rays to be reflected, and further improving the display performance of the display panel 10.

In the present disclosure, the thicknesses of the first conductive portion 223, the second conductive portion 224, and the additional conductive portion 212 are set to be all less than 400 Å, so that when subsequently etched, there is neither residue nor crystal, thereby ensuring the display quality and effect of the display panel 10.

Figure 12:
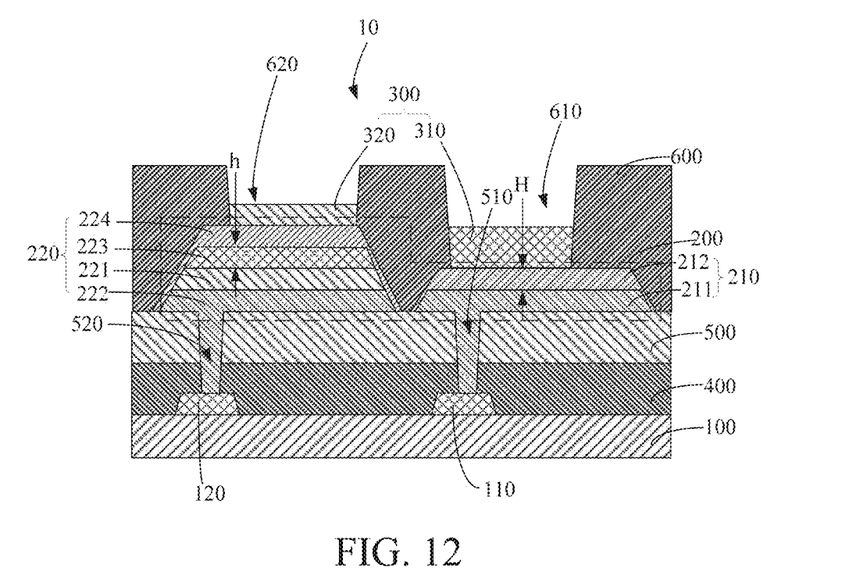

In an embodiment, after step B13, the method further includes:
referring to FIG. 12, disposing a pixel definition layer 600 on the interlayer dielectric layer 500 and the anode layer 200. The pixel definition layer 600 is provided with a first via hole 610 and a second via hole 620. The first via hole 610 runs through the pixel definition layer 600 to expose the first anode 210. The second via hole 620 runs through the pixel definition layer 600 to expose the second anode 220.

B13. Form a light-emitting layer on the anode layer. The light-emitting layer includes a green light emitting portion and a blue light emitting portion. The green light emitting portion is disposed on the first anode, and the blue light emitting portion is disposed on the second anode.

Still referring to FIG. 12, specifically, a green light emitting portion 310 of the light-emitting layer 300 is disposed in the first via hole 610. A blue light emitting portion 320 of the light-emitting layer 300 is disposed in the second via hole 620.

In the present disclosure, the first reflection portion 211 of the first anode 210, the first additional reflection portion 222 of the second anode 220, the second reflection portion 221 of the second anode 220, and the second anode 220 can be formed using a single mask, thereby simplifying the preparation process of the display panel 10, and improving the production efficiency. The first anode 210 corresponding to the green light emitting portion 310 is made of the material with the low reflectivity, reducing the light emitting efficiency of the region of the green light emitting portion 310, that is, reducing the light emitting efficiency of green sub-pixels, while the second anode 220 corresponding to the blue light emitting portion 320 is made of the material with the high reflectivity, improving the light emitting efficiency of the region of the blue light emitting portion 320, that is, improving the light emitting efficiency of blue sub-pixels, so that the light emitting efficiencies of the green sub-pixels and the blue sub-pixels are balanced, thereby improving the display uniformity of the display panel 10. The rough structure is disposed on a surface of the second reflection portion 221 close to the light-emitting layer 300, to further improve the light emitting efficiency of the blue sub-pixels, thereby further improving the display uniformity of the display panel 10. The thicknesses of the additional conductive portion 212, the first conductive portion 223, and the second conductive portion 224 deposited each time are set to be all less than 400 Å, so that when subsequently etched, there is no residue in the region outside the first reflection portion 211 and the second reflection portion 221, thereby ensuring the display quality of the display panel 10.

A display panel 10 and a preparation method thereof are disclosed in the present disclosure. The display panel 10 includes an array substrate 100, an anode layer 200, and a light-emitting layer 300. The anode layer 200 is disposed on the array substrate 100 and the anode layer 200 includes a first anode 210 and a second anode 220. There is a gap between the first anode 210 and the second anode 220. The first anode 210 includes a first reflection portion 211, and the second anode 220 includes a second reflection portion 221. A reflectivity of the first reflection portion 211 is less than a reflectivity of the second reflection portion 221. The light-emitting layer 300 is disposed on the anode layer 200 and the light-emitting layer 300 includes a green light emitting portion 310 and a blue light emitting portion 320. The green light emitting portion 310 is disposed on the first anode 210, and the blue light emitting portion 320 is disposed on the second anode 220. In the present disclosure, the first anode 210 corresponding to the green light emitting portion 310 is made of the material with a low reflectivity, reducing the light emitting efficiency of a region of the green light emitting portion 310, while the second anode 220 corresponding to the blue light emitting portion 320 is made of the material with a high reflectivity, improving the light emitting efficiency of a region of the blue light emitting portion 320, so that the light emitting efficiencies of the regions of the green light emitting portion 310 and the blue light emitting portion 320 are balanced, thereby improving the display uniformity of the display panel 10.

A display panel and a preparation method thereof provided in the embodiments of the present disclosure are described above in detail. Although the principles and implementations of the present disclosure are described by using specific examples in this specification, the descriptions of the above embodiments are merely intended to help understand the method and the core idea of the method of the present disclosure. Meanwhile, a person of ordinary skill in the art may make modifications to the specific implementations and application range according to the idea of the present disclosure. In conclusion, the content of this specification is not construed as a limit on the present disclosure.

What is claimed is:

1. A display panel, comprising:
an array substrate;
a planarization layer, disposed on the array substrate;
an anode layer, disposed on the planarization layer, wherein the anode layer comprises a first anode and a second anode; there is a gap between the first anode and the second anode; the first anode comprises a first reflection portion, and the second anode comprises a second reflection portion; and a reflectivity of the first reflection portion is less than a reflectivity of the second reflection portion; and
a light-emitting layer, disposed on the anode layer, wherein the light-emitting layer comprises a green light emitting portion and a blue light emitting portion; and the green light emitting portion is disposed on the first anode, and the blue light emitting portion is disposed on the second anode,
wherein the first anode further comprises an additional conductive portion, the additional conductive portion being located on the first reflection portion, and the second anode further comprises a first conductive portion and a second conductive portion, the first conductive portion and the second conductive portion being sequentially stacked on the second reflection portion.

2. The display panel as claimed in claim 1, wherein a surface of the second reflection portion close to the light-emitting layer comprises a rough structure.

3. The display panel as claimed in claim 1, wherein the reflectivity of a material of the first reflection portion is less than 65%, and the reflectivity of a material of the second reflection portion is greater than 88%.

4. The display panel as claimed in claim 3, wherein the material of the first reflection portion comprises one or a combination of two or more of molybdenum, titanium, and copper, and the material of the second reflection portion comprises one or a combination of silver and aluminum.

5. The display panel as claimed in claim 1, wherein the thicknesses of the first conductive portion, the second conductive portion, and the additional conductive portion are all less than 400 Å.

6. The display panel as claimed in claim 1, wherein a sum of the thicknesses of the first conductive portion and the second conductive portion is in a range of 400 to 1200 Å.

7. The display panel as claimed in claim 1, wherein the second anode further comprises a first additional reflection portion, the first additional reflection portion being disposed between the second reflection portion and the array substrate.

8. The display panel as claimed in claim 1, wherein the second conductive portion covers the second reflection portion and the first conductive portion.

9. The display panel as claimed in claim 1, wherein the display panel further comprises an interlayer dielectric layer, the interlayer dielectric layer being disposed between the planarization layer and the anode layer.

10. A display panel, comprising:
an array substrate;
an anode layer, disposed on the array substrate, wherein the anode layer comprises a first anode and a second anode; there is a gap between the first anode and the second anode; the first anode comprises a first reflection portion, and the second anode comprises a second reflection portion; and a reflectivity of the first reflection portion is less than a reflectivity of the second reflection portion; and
a light-emitting layer, disposed on the anode layer, wherein the light-emitting layer comprises a green light emitting portion and a blue light emitting portion; and the green light emitting portion is disposed on the first anode, and the blue light emitting portion is disposed on the second anode,
wherein the first anode further comprises an additional conductive portion, the additional conductive portion being located on the first reflection portion, and the second anode further comprises a first conductive portion and a second conductive portion, the first conductive portion and the second conductive portion being sequentially stacked on the second reflection portion.

11. The display panel as claimed in claim 10, wherein a surface of the second reflection portion close to the light-emitting layer comprises a rough structure.

12. The display panel as claimed in claim 10, wherein the reflectivity of a material of the first reflection portion is less than 65%, and the reflectivity of a material of the second reflection portion is greater than 88%.

13. The display panel as claimed in claim 12, wherein the material of the first reflection portion comprises one or a combination of two or more of molybdenum, titanium, and copper, and the material of the second reflection portion comprises one or a combination of silver and aluminum.

14. The display panel as claimed in claim 10, wherein the thicknesses of the first conductive portion, the second conductive portion, and the additional conductive portion are all less than 400 Å.

15. The display panel as claimed in claim 10, wherein a sum of the thicknesses of the first conductive portion and the second conductive portion is in a range of 400 to 1200 Å.

16. The display panel as claimed in claim 10, wherein the second anode further comprises a first additional reflection portion, the first additional reflection portion being disposed between the second reflection portion and the array substrate.

17. The display panel as claimed in claim 10, wherein the second conductive portion covers the second reflection portion and the first conductive portion.

18. A preparation method of a display panel, comprising:
providing an array substrate;
forming an anode layer on the array substrate, wherein the anode layer comprises a first anode and a second anode; there is a gap between the first anode and the second anode; the first anode comprises a first reflection portion, and the second anode comprises a second reflection portion; and a reflectivity of the first reflection portion is less than a reflectivity of the second reflection portion; and
forming a light-emitting layer on the anode layer, wherein the light-emitting layer comprises a green light emitting portion and a blue light emitting portion; and the green light emitting portion is disposed on the first anode, and the blue light emitting portion is disposed on the second anode,
wherein the first anode further comprises an additional conductive portion, the additional conductive portion being located on the first reflection portion, and the second anode further comprises a first conductive portion and a second conductive portion, the first conductive portion and the second conductive portion being sequentially stacked on the second reflection portion.

* * * * *